(12) United States Patent
Aude

(10) Patent No.: US 6,710,732 B1
(45) Date of Patent: Mar. 23, 2004

(54) THREE-STATE BINARY ADDERS WITH ENDPOINT CORRECTION AND METHODS OF OPERATING THE SAME

(75) Inventor: Arlo J. Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/569,955

(22) Filed: May 12, 2000

(51) Int. Cl.[7] .............................. H03M 1/12; H03M 1/38
(52) U.S. Cl. ........................................ 341/155; 341/161
(58) Field of Search ................................. 341/155, 161, 341/118

(56) References Cited

U.S. PATENT DOCUMENTS

| | | | | |
|---|---|---|---|---|
| 5,638,071 A | * | 6/1997 | Cappofreddi | ................ 341/118 |
| 5,710,563 A | * | 1/1998 | Vu et al. | ..................... 341/161 |
| 6,124,820 A | * | 9/2000 | Norman | ...................... 341/161 |
| 6,222,477 B1 | * | 4/2001 | Irie et al. | ..................... 341/161 |

* cited by examiner

*Primary Examiner*—Trong Phan

(57) ABSTRACT

Three-state binary adders with endpoint correction are employed in a digital signal processing system within a pipelined analog-to-digital converter. The adder is operable to add received signals. The endpoint correction circuitry, which is associated with the adder, is operable to (i) use ±½ full scale tip voltages and to (ii) generate over and under indicators.

20 Claims, 10 Drawing Sheets

$S = \overline{b} \text{ XNOR } (\overline{\overline{ci} \cdot \overline{a}}) = b \text{ XNOR } \overline{(a + ci)}$ $\overline{CO} = \overline{\overline{b} + (\overline{ci} \cdot \overline{a})} = b\,(a + ci)$

FIG. 9

THREE-STATE BINARY ADDERS WITH ENDPOINT CORRECTION AND METHODS OF OPERATING THE SAME

CROSS REFERENCE TO RELATED APPLICATIONS

The present invention is related to that disclosed in U.S. patent application Ser. No. 09/569,954, entitled "Three-State Binary Adders and Methods of Operating the Same," which application is commonly assigned to the Assignee of the present invention and filed May 12, 2000. The disclosure of this related patent application is incorporated herein by reference for all purposes as if fully set forth herein.

TECHNICAL FIELD OF THE INVENTION

The present invention relates generally to optimized adders, and more specifically to three-state binary adders with endpoint correction for use in pipelined analog-to-digital converters.

BACKGROUND OF THE INVENTION

Conventional data conversion devices often include an analog-to-digital converter ("ADC").

ADCs operate primarily to quantize analog data signals for use in digital signal processing. In recent years, the need for more powerful digital signal processing systems has continued to increase, thereby requiring higher resolution and more accurate ADCs.

Conventional ADCs have commonly employed switched capacitor elements and differential amplifiers. These switched capacitor elements, in order to obtain the necessary accuracy, must be accurately matched, thereby requiring the manufacturing process to achieve high levels of accuracy, which may be difficult due to matching limitations between components. Since these limitations commonly exceed manufacturing process capabilities, various calibration techniques have been implemented.

Conventional ADCs address various ones of the above-noted disadvantages. One such conventional ADC is known as a "pipelined ADC." A pipelined ADC operates to convert an analog signal received at the input of a pipeline of "n" stages into an "n"-bit digital output signal. Each converter stage is, essentially, a sub-ADC and a reconstructing digital-to-analog converter ("DAC").

For instance, in a typical pipelined ADC, a "first" stage receives the analog input voltage and, in response to the analog level, converts the same to generate the most significant bit ("MSB") of the resulting digital signal. Subsequent stages in turn refine the determination of the value of the signal, producing additional bits in less significant positions of the resulting digital signal.

More specifically, an initial "coarse" conversion of a voltage $V_{IN}$ is made by a $n^{th}$-bit sub-ADC, which coarse conversion is a $n^{th}$-bit approximation of the input voltage $V_{IN}$. Commonly, a $n^{th}$-bit DAC converts this $n^{th}$-bit digital approximation back into an analog signal, which represents the "coarse" $n^{th}$-bit approximation of the input voltage $V_{IN}$. This "$n^{th}$-bit" analog signal is then subtracted from the actual input voltage $V_{IN}$, and the resulting remainder, or "residue," of the first $n^{th}$-bit conversion represents the residual portion of the input voltage $V_{IN}$ that was not accurately converted by the $n^{th}$-bit sub-ADC.

This residual portion is amplified to enlarge the conversion range for a second or "finer" conversion performed by a $m^{th}$-bit sub-ADC. This "finer" $m^{th}$-bit digital approximation of the input voltage $V_{IN}$ by the $m^{th}$-bit sub-ADC is passed to an adder where it is added to the "coarse" $n^{th}$-bit conversion previously performed by the $n^{th}$-bit sub-ADC.

This multi-stage process is repeated until the pipeline is complete, with the residue of each stage being amplified and quantized by the following stage. The limiting example of such an extension is a one-bit-per-stage architecture, which requires only one comparator per added bit of resolution desired. The gain of the inter-stage amplifier is set such that coarse and fine conversions have a one-bit overlap so as to allow for the correction of errors made in the coarse conversion.

Multi-stage pipeline ADC architectures provide a scalable approach that reduces significantly the total number of comparators required to perform a conversion. This reduction in the number of required comparators results in a significant die area and power consumption savings for the ADC.

Traditional correction logic in a pipelined ADC is implemented as "full" addition and carry over of the overlapping correction bits from each stage. One traditional approach, known as the threshold limit algorithm, has theoretical trip voltages for a two bit sub-converter of ±½ full scale and zero, and has an error tolerance of zero.

Another contemporary approach, known as the compensated algorithm, improves the margin of error relative to the threshold limit algorithm by increasing the two-bit subcomparator trip points to ±¾ full scale. The added ±¼ full scale offset allows for an improved error margin relative to the threshold limit algorithm. This offset, however, translates into a differential non-linearity ("DNL") error of ¼ of the least significant bit at codes 1 and $(2^n-2)$.

Unfortunately, both of these algorithms suffer non-monotonic error throughout the conversion range when the error constraints are not met.

A need therefore exists in the art for a binary adder that further increases the efficiencies of pipelined ADCs and reduces the die area and power consumption requirements of the ADC. A further need exists for a three-state binary adder that eliminates the logic necessary for a "11" state in pipelined ADCs. A yet further need in the art exists for an algorithm that eliminates both DNL error and non-monotonicity problems in endpoint correction.

SUMMARY OF THE INVENTION

To address the above-discussed deficiencies of the prior art, it is a primary object of the present invention to provide optimized adders and, more specifically, three-state binary adders with endpoint correction for use in pipelined analog-to-digital converters. According to one advantageous embodiment, for use in a digital signal processing system, a pipelined analog-to-digital converter is introduced comprising an adder and endpoint correction circuitry. The adder is operable to add received signals. The endpoint correction circuitry, which is associated with the adder, is operable to (i) use ±½ fill scale trip voltages and to (ii) generate over and under indicators.

Important aspects of the principles of the present invention, include that use of three-state binary adders in pipelined analog-to-digital converters, as well as other digital signal processing systems, is easily scalable, significantly reduces delay, and requires less area than an overlapping adder using standard full-adder and half-adder cells. Further, the endpoint correction algorithm hereof eliminates both DNL error and non-monotonicity problems in endpoint correction.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 9 illustrates a table of a code map for the three-bit analog-to-digital converter of FIG. 8 comparing the threshold limit algorithm, the compensated algorithm and a corrected algorithm in accordance with the principles of the present invention;

DETAILED DESCRIPTION OR THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the three-state binary adder and methods of operating the same set forth herein may be implemented in any suitably arranged digital signal processing circuitry or system.

Figure 1:
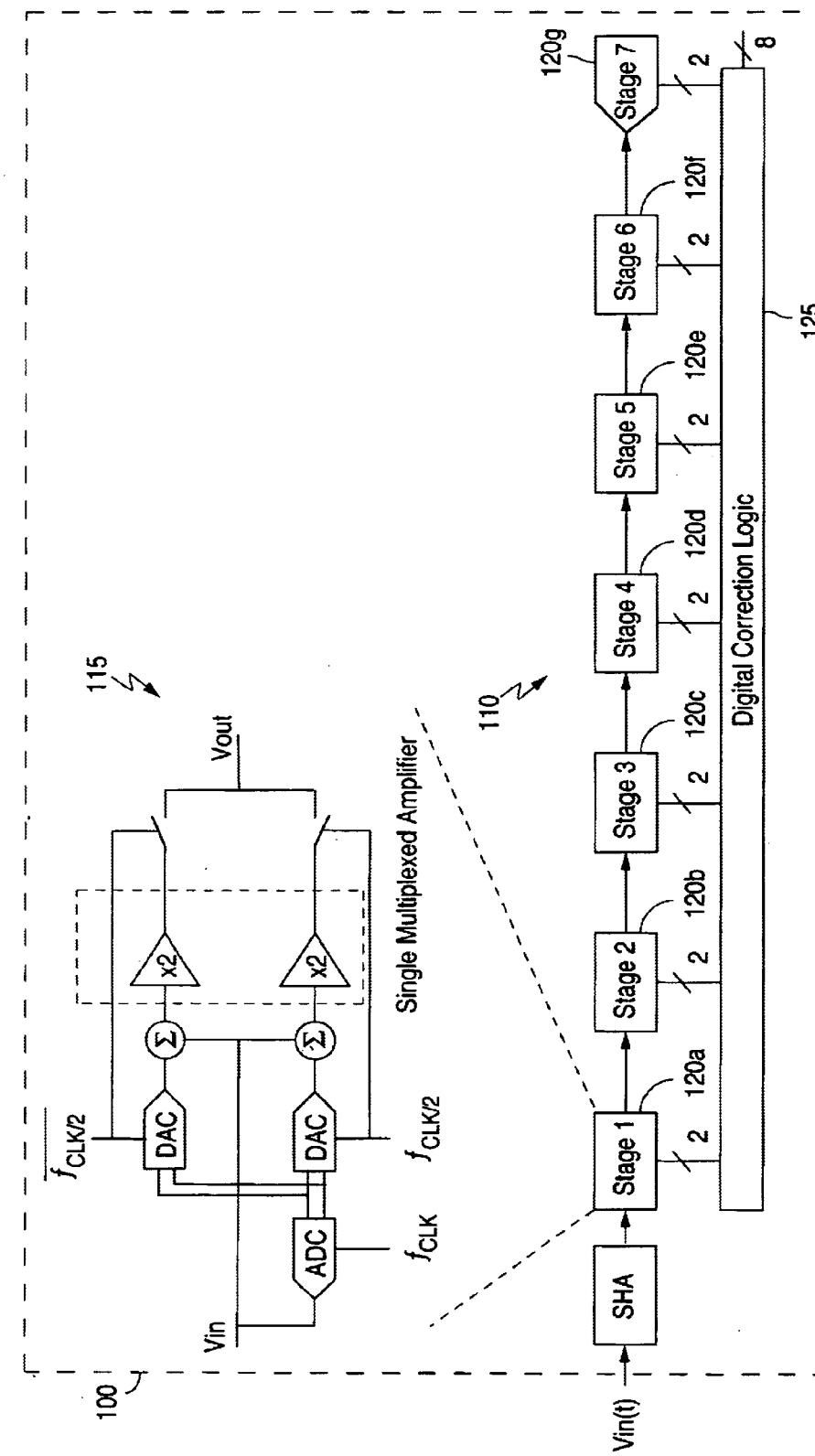
FIG. 1 illustrates a block diagram of a prior art digital signal processing system having an analog-to-digital convertor.

Turning initially to FIG. 1 illustrated is a block diagram of an exemplary prior art digital signal processing system 100 including an analog-to-digital convertor ("ADC", generally designated 110) which may suitably employ a three-stage binary adder of the type constructed in accordance with the principles of the present invention. Digital signal processing system 100 is illustratively an Ethernet physical layer system. Exemplary ADC 110 is a pipelined 125 MSPS 8 bit ADC that uses a double sampling approach implemented in a 0.3 μm process for use in a 10/100/1000 Ethernet physical layer system.

Pipelined ADC 110 is illustratively based on a Standard 1.5b per stage pipelined ADC architecture that is well described in "A 10b 20 MSamples/sec Analog-to-digital Converter, " by S. Lewis, J. of Solid-State Circuits, pp. 281–87 (March 1992), which is incorporated herein by reference for all purposes as if fully set forth herein. Pipelined ADC 110 includes sample and hold circuitry 115, seven sub-ADCs 120a to 120g, and digital correction logic 125.

An input voltage signal Vin(t) is provided to sample and hold amplifier SHA. The output voltage of SHA that is provided to Stage 1 is denoted Vin. As shown in FIG. 1, Stage 1 comprises sample and hold circuitry 115. Sample and hold circuitry 115 comprises an analog to digital converter (ADC), and two digital to analog converters (DAC). The digital output signal of ADC that is provided to digital correction logic 125 is denoted $f_{CLK}$. The output of ADC is provided to the two digital to analog converters DAC. As is well known in the art, the analog output of the DACs is subtracted from the analog input Vin to produce an analog residue signal. The analog residue signal is provided to a single multiplexed amplifier. The output of the single multiplexed amplifier is denoted Vout. Digital signal $f_{CLK/2}$ is output from the first DAC and the inverse of digital signal $f_{CLK/2}$ is output from the second DAC to switch the output of the single multiplexed amplifier. The details of the operation of sample and hold circuitry are described in the paper by S. Lewis mentioned above.

Figure 2:
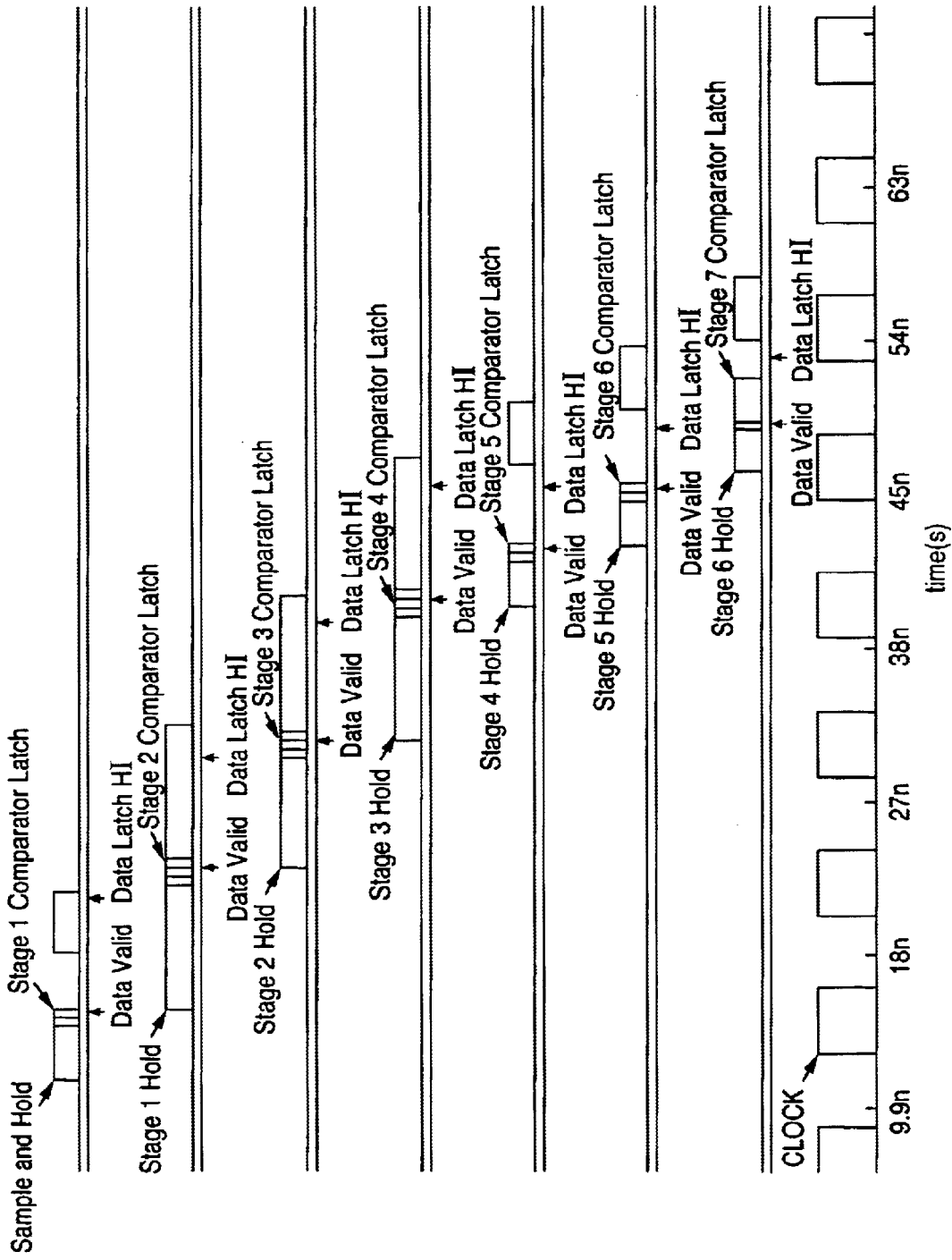
FIG. 2 illustrates an exemplary timing diagram of a prior art clocking scheme that may be used with a pipelined analog-to-digital convertor, such as that of FIG. 1.

Turning concurrently to FIG. 2, illustrated is an exemplary prior art timing diagram of a clocking scheme that may be used with pipelined ADC 110 of the present invention. Pipelined ADC 110 uses a technique commonly known as "double sampling" to double effectively the speed of the pipeline. Double sampling is well described in "8b 75 MSAMPLES/SEC 70 mW PARALLEL PIPELINED ADC INCORPORATING DOUBLE SAMPLING," by W. Bright, *ISSCC98*, *Session 9 ADCs, Paper FA* 9.5 (1998), which is incorporated herein by reference for all purposes as if fully set forth herein.

The line at the bottom of FIG. 2 illustrates the operation of CLOCK signal on a time scale. The letter "n" on the time scale denotes one nanosecond. FIG. 2 shows the timing for each "Hold" signal, and for each "Comparator Latch" signal, and for each "Data Valid" signal, and for each "Data Latch HI" signal for each stage of the seven (7) stages of the prior art pipelined ADC 110 shown in FIG. 1.

Traditionally, a pipelined ADC uses two semi-independent pipelines each clocked at one half the sampling frequency of the system where the clock to one converter is delayed by one half the clock cycle. This architecture suffers from many error sources.

In contrast, the double sampling system used in this design employs "single sampling" sample and hold circuitry 115 to drive two independent sampling systems in the first stage where there is a single amplifier. The amplifier works in the hold mode throughout the entire clock cycle except for a small period before switching between the two sampling networks where a reset phase restores amplifier outputs to a common mode voltage, as is illustratively depicted by sub-ADC 120a in FIG. 1.

According to the simplified diagram of the clocking scheme illustrated in FIG. 2, a reset phase is indicated by the dead band between subsequent hold phases. A 125 MHz sampling clock is divided by two n the rising edges to produce a non-overlapping two phase 62.5 MHz sampling clock, with duty cycle variation minimized, which allows for a design with maximum sample and hold times.

A primary advantage of this scheme is to increase sample and hold times by more than a factor of two. However, because two sampling systems are used, capacitor matching requirements may be doubled, although this is mitigated by the reduction in error obtained by using capacitor swapping. In the instant embodiment, the sample and hold amplifier SHA is a single sampling system, whereas exemplary sub-ADC stages 1 to 6 (120a to 120f) are double sampling.

Exemplary digital correction logic 125 includes a plurality of overlapping three-state adders (shown with reference to FIGS. 3 to 6) in accordance with the principles of the present invention. Thus, digital correction logic 125 resembles generally the overlapping adders traditionally used by pipelined ADCs, wherein each stage of a pipelined ADC produces two bits of data.

Two data bits have four possible combinations, namely, "00," "01," "10" and "11." However, each stage of a 1.5 b per stage pipelined ADC, such as ADC 110, has but three valid states, namely, "00," "01" and "10;" put differently, logic state "11" is unused. Accordingly, circuit logic necessary for performing three-state binary addition is simpler relative to circuit logic for a full adder.

Turning to TABLE 1, illustrated is an exemplary digital correction scheme:

TABLE 1

| | DATA 7 [1] | DATA 6 [0] | DATA 5 [0] | DATA 4 [0] | DATA 3 [0] | DATA 2 [0] | DATA 1 [0] | DATA 0 [1] |
|---|---|---|---|---|---|---|---|---|
| STAGE 1 | d13 [0] | d12 [1] | | | | | | |
| STAGE 2 | | d11 [0] | d10 [1] | | | | | |
| STAGE 3 | | | d09 [0] | d08 [1] | | | | |
| STAGE 4 | | | | d07 [0] | d06 [1] | | | |
| STAGE 5 | | | | | d05 [0] | d04 [1] | | |
| STAGE 6 | | | | | | d03 [0] | d02 [1] | |
| STAGE 7 | | | | | | | d01 [1] | d00 [1] |

According to TABLE 1, the data bits are generated at successive stages and are added with one data bit of overlap to generate an eight-bit output. By way of example, each of Stage 1 to Stage 7 includes a possible code in the upper right hand corner. The summed result for this example is located in top right hand corner of the bottom row cells, namely, the data 0 cell.

According to one advantageous embodiment, three corrected adder cells may be used to reduce the circuit logic relative to a full adder and to generate a three-state binary adder according to the principles of the present invention. According to this embodiment, the three corrected adder cells were created for three adding circumstances, namely:

TABLE 2

| CASE NO. | STAGE(S) |
|---|---|
| 1 | The overlap addition of Stage 7 |
| 2 | The overlap addition of Stages 6 to 2 |
| 3 | Carry over to d13 of Stage 1 (See TABLE 1) |

Figures 3, 4:
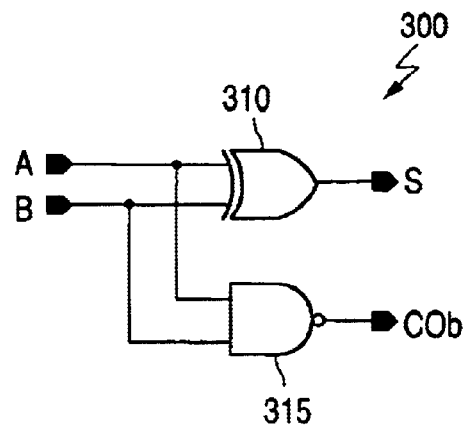
FIG. 3 illustrates a block diagram of a first one of three corrected adder cells that may be used to reduce the circuit logic to generate a three-state binary adder according to the principles of the present invention.
FIG. 4 illustrates a block diagram of a second one of three corrected adder cells that may be used to reduce the circuit logic to generate a three-state binary adder according to the principles of the present invention.

Turning to FIG. 3, illustrated is a block diagram of an exemplary first one of three corrected adder cells (generally designated 300) that may be used to reduce the circuit logic to generate a three-state binary adder according to the principles of the present invention. Exemplary corrected adder cell 300 illustratively includes an XOR gate 310 to perform the summing function in parallel with a NAND gate 315 to perform the carry function. The logic function of corrected adder cell 300 is given by:

$$s = a \text{ xor } b \quad (1)$$

$$co = a \cdot b \quad (2)$$

According to this embodiment, the minimum logic necessary to implement Case 1, or the first one of the three corrected adder cells, is as shown in TABLE 3.

TABLE 3

| A | B | s | co |
|---|---|---|---|
| 0 | 0 | 0 | 0 |
| 0 | 1 | 1 | 0 |
| 1 | 0 | 1 | 0 |
| 1 | 1 | 0 | 1 |

One aspect of exemplary corrected adder cell 300 is that the carry out term is inverted. This logic performs the function of a half adder and is capable of reducing one gate delay through the exemplary carry out chain. A well known method for designating an inverted signal places a bar over the letter that represents the signal. A second well known method for designating an inverted signal places a lower case letter "b" after the letter. The inverted carry out bit in FIG. 3 is designated with the letters COb.

Turning to FIG. 4, illustrated is a block diagram of an exemplary second one of three corrected adder cells 400 that may be used to reduce the circuit logic to generate a three-state binary adder according to the principles of the present invention. Exemplary corrected adder cell 400 illustratively includes sub-circuitry operable to determine a sum (generally designated 405) and a carry (generally designated 410). Corrected adder cell 400 receives three inputs, namely, A (most significant bit ("MSB")), B (least significant bit ("LSB")), and CI (the carry-out bit generated by corrected adder cell 300). Exemplary summing sub-circuitry 405 in FIG. 4 includes a NAND gate 415 in series with a XNOR gate 420 to perform the summing function. Exemplary carry sub-circuitry 410 in FIG. 4 includes two inverters 425 and 430 in series with AND gate 435 in series with a NOR gate 440 to perform the carry function. The logic function of corrected adder cell 400 is given by:

$$s = b \text{ xnor } \overline{(a+ci)} \quad (3)$$

$$co = b\,(a+ci) \quad (4)$$

According to this embodiment, the minimum logic necessary to implement Case 2, or the second one of the three corrected adder cells, is as shown in TABLE 4.

TABLE 4

| ci | A | B | s | co |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | x | x |
| 1 | 1 | 0 | 0 | 1 |
| 1 | 1 | 1 | x | x |

One aspect of exemplary corrected adder cell 400 is that TABLE 4 characterizes all valid cases implied by Case 2, with the constraint that no stage will output a binary code value of "11."

Figure 5:
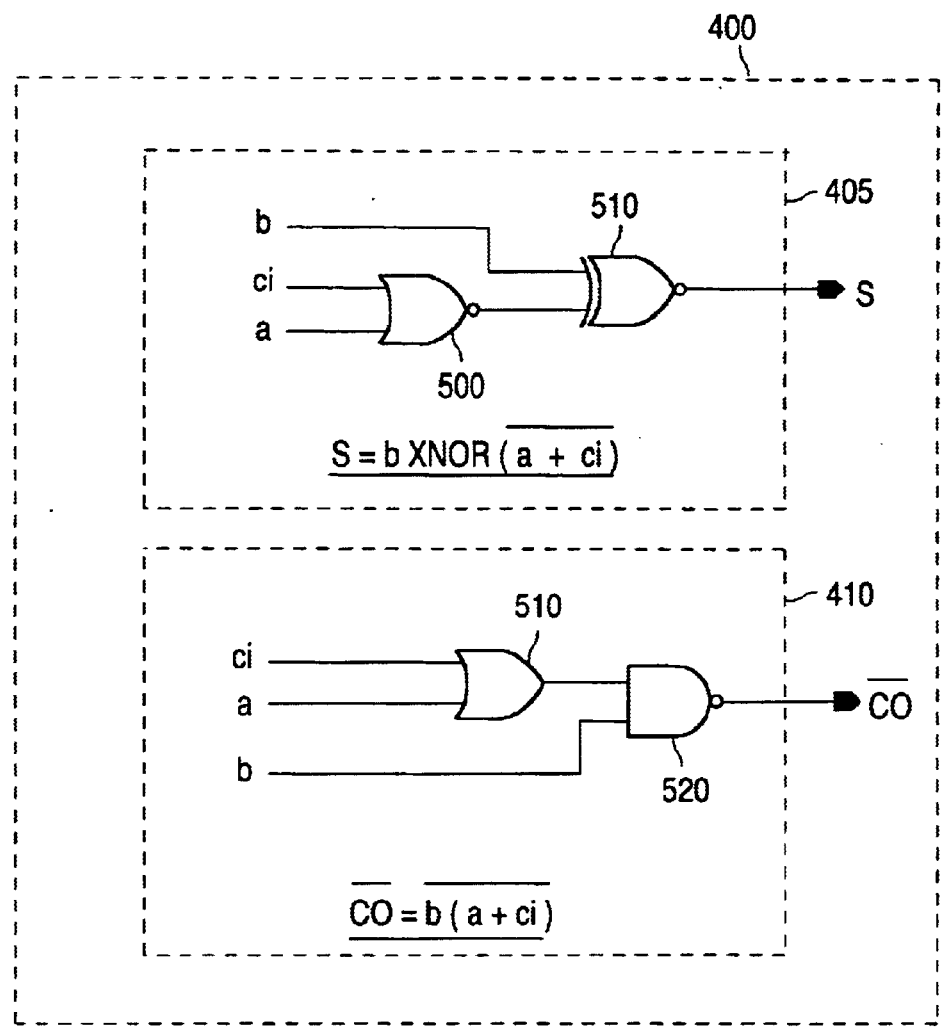
FIG. 5 illustrates a block diagram of an alternate embodiment of the second one of three corrected adder cells introduced with reference to FIG. 4.

Turning to FIG. 5, illustrated is a block diagram of an alternate embodiment of the second one of three corrected adder cells (generally designated 400) introduced with reference to FIG. 4. Exemplary alternate corrected adder cell 400 illustratively includes sub-circuitry operable to determine a sum (generally designated 405) and a carry (generally designated 410). Corrected adder cell 400 again receives three inputs, namely, A (most significant bit ("MSB")), B (least significant bit ("LSB")), and CI (the carry-out bit generated by corrected adder cell 300). Exemplary summing sub-circuitry 405 in FIG. 5 includes a NOR gate 500 in series with a XNOR gate 510 to perform the summing function. Exemplary carry sub-circuitry 410 in FIG. 5 includes an OR gate 515 in series with a NAND gate 520 to perform the carry function.

Figure 6:
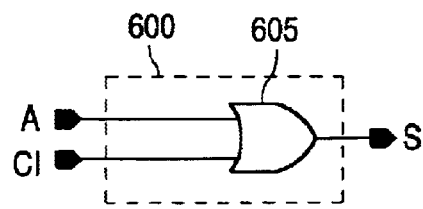
FIG. 6 illustrates a block diagram of a third one of three corrected adder cells that may be used to reduce the circuit logic to generate a three-state binary adder according to the principles of the present invention.

Turning to FIG. 6, illustrated is a block diagram of a third one of three corrected adder cells (generally designated 600) that may be used to reduce the circuit logic to generate a three-state binary adder according to the principles of the present invention. Exemplary corrected adder cell 600 illustratively includes sub-circuitry operable to determine a sum (generally designated 605). Corrected adder cell 600 receives two inputs, namely, A (most significant bit ("MSB")) and CI (the carry-out bit generated by corrected adder cell 400). Exemplary summing sub-circuitry 605 includes an OR gate 610 to perform the summing function. The logic function of corrected adder cell 600 is given by:

$$s = a + ci \quad (5)$$

According to this embodiment, the minimum logic necessary to implement Case 3, or the third one of the three corrected adder cells, is as shown in TABLE 5.

TABLE 5

| A (d13) | ci | s | co |
|---|---|---|---|
| 0 | 0 | 0 | 0 |
| 0 | 1 | 1 | 0 |
| 1 | 0 | 1 | 0 |
| 1 | 1 | x | x |

Corrected adder cell 600 is simply a carry over into the MSB. A carry out signal is not generated.

Figure 7:
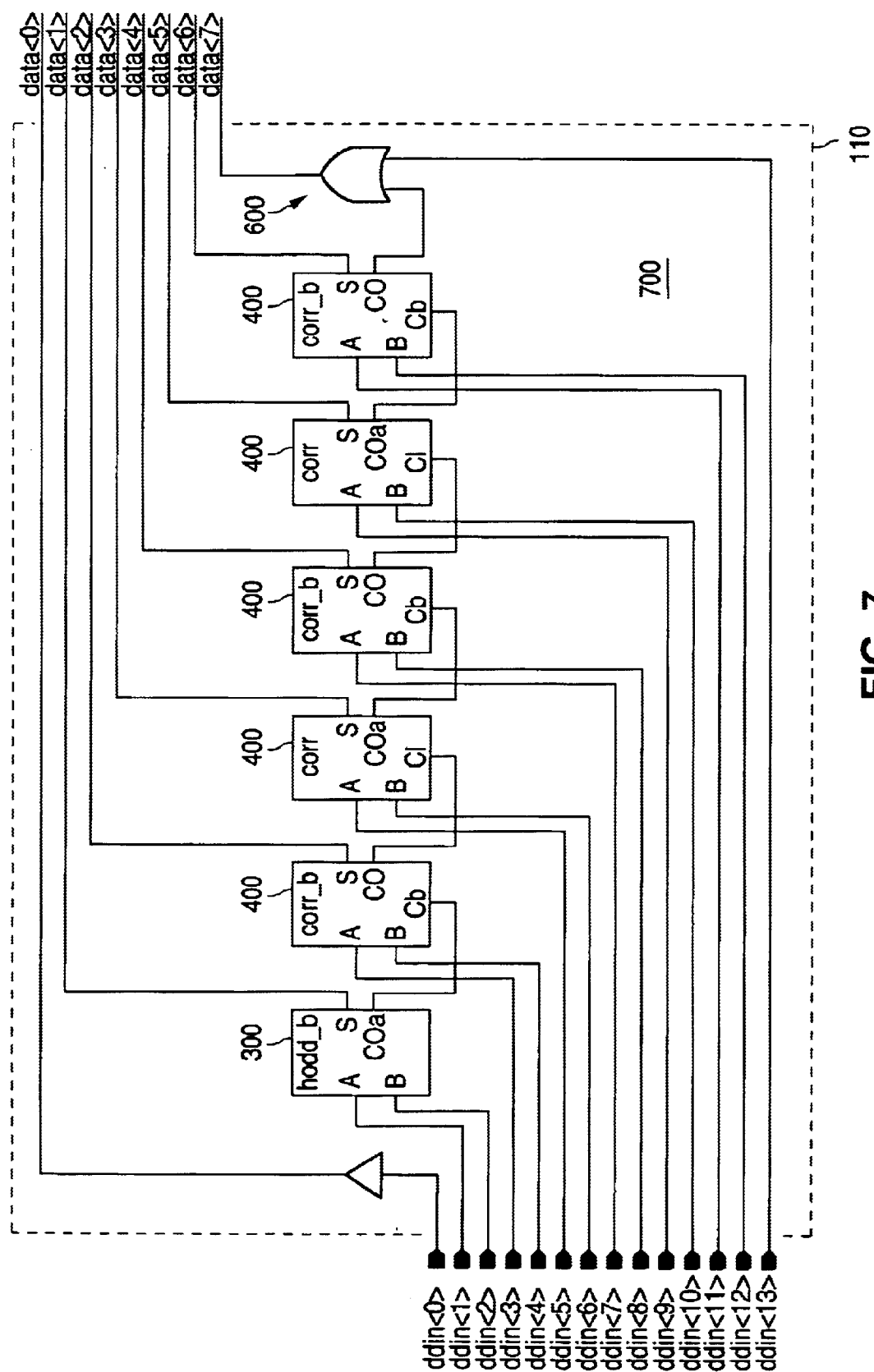
FIG. 7 illustrates a block diagram of the pipelined analog-to-digital converter of FIG. 1 which includes a fully corrected adder in accordance with the principles of the present invention.

Turning to FIG. 7, illustrated is a block diagram of pipelined ADC 110 which includes a fully corrected adder (generally designated 700) in accordance with the principles of the present invention. Exemplary fully corrected adder 700 illustratively includes one corrected adder cell 300 (Case 1), five corrected adder cells 400 (Case 2) and one corrected adder cell 600 (Case 3). According to this embodiment, a maximum delay from data in (from input lines ddin<0> through ddin<13>) to valid data out (from output lines data<0> through data <7>) occurs at the transition from code 127 to code 128. In this case, the LSB forces a carry out for each stage of the adder until the MSB toggles. To reduce this delay, the corrected adder cells are arranged to provide an inversion of the carry out signal between each stage, thereby reducing the maximum delay by one inverter delay per stage. Important aspects of this implementation, and the principles of the present invention, include that this scheme is easily scalable, significantly reduces delay, and requires less area than an overlapping adder using standard full-adder and half-adder cells.

Figure 8:
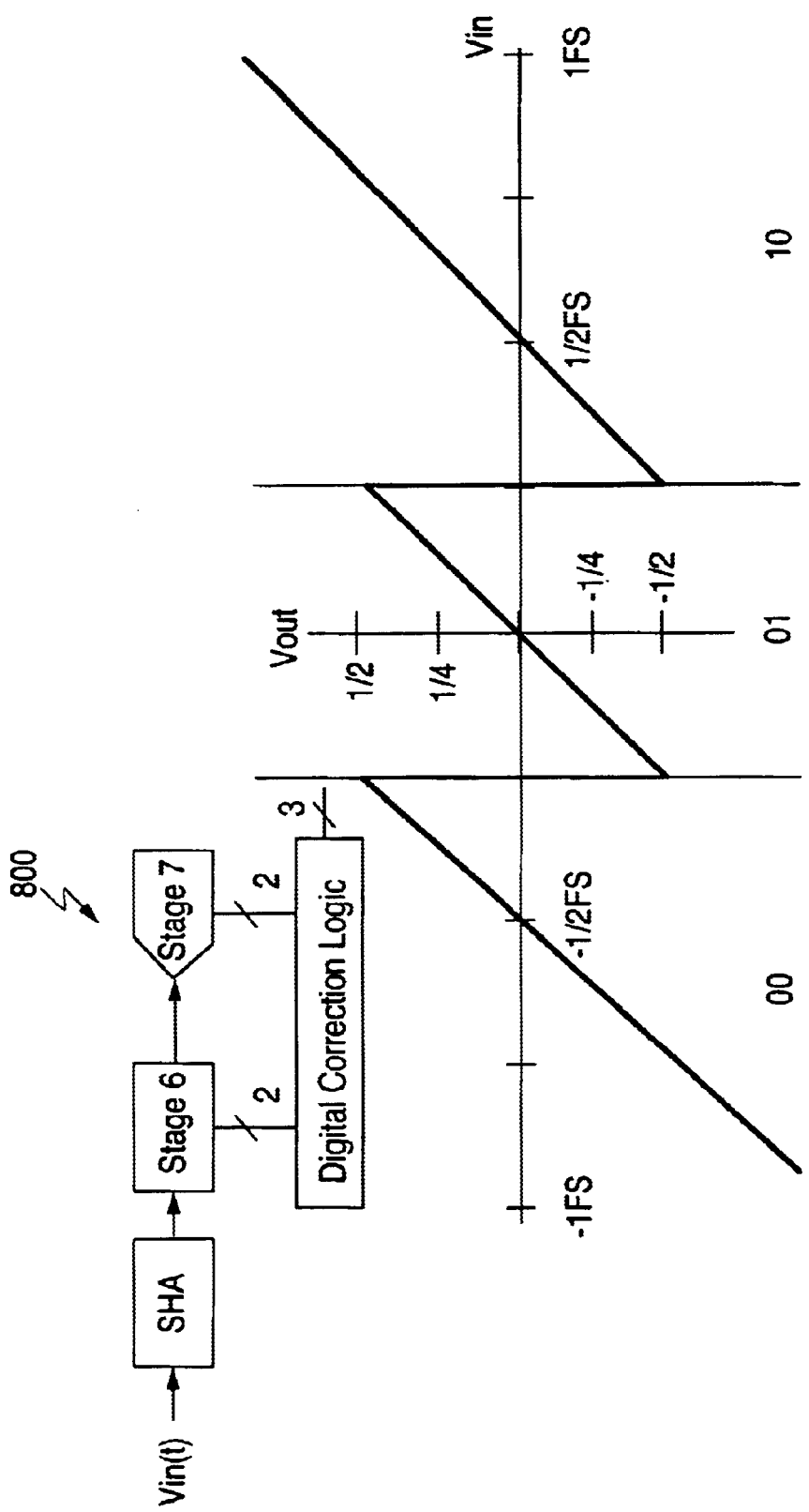
FIG. 8 illustrates a graphical diagram of a residue plot of an exemplary three-bit analog-to-digital converter in accordance with the principles of the present invention.
Figure 9:
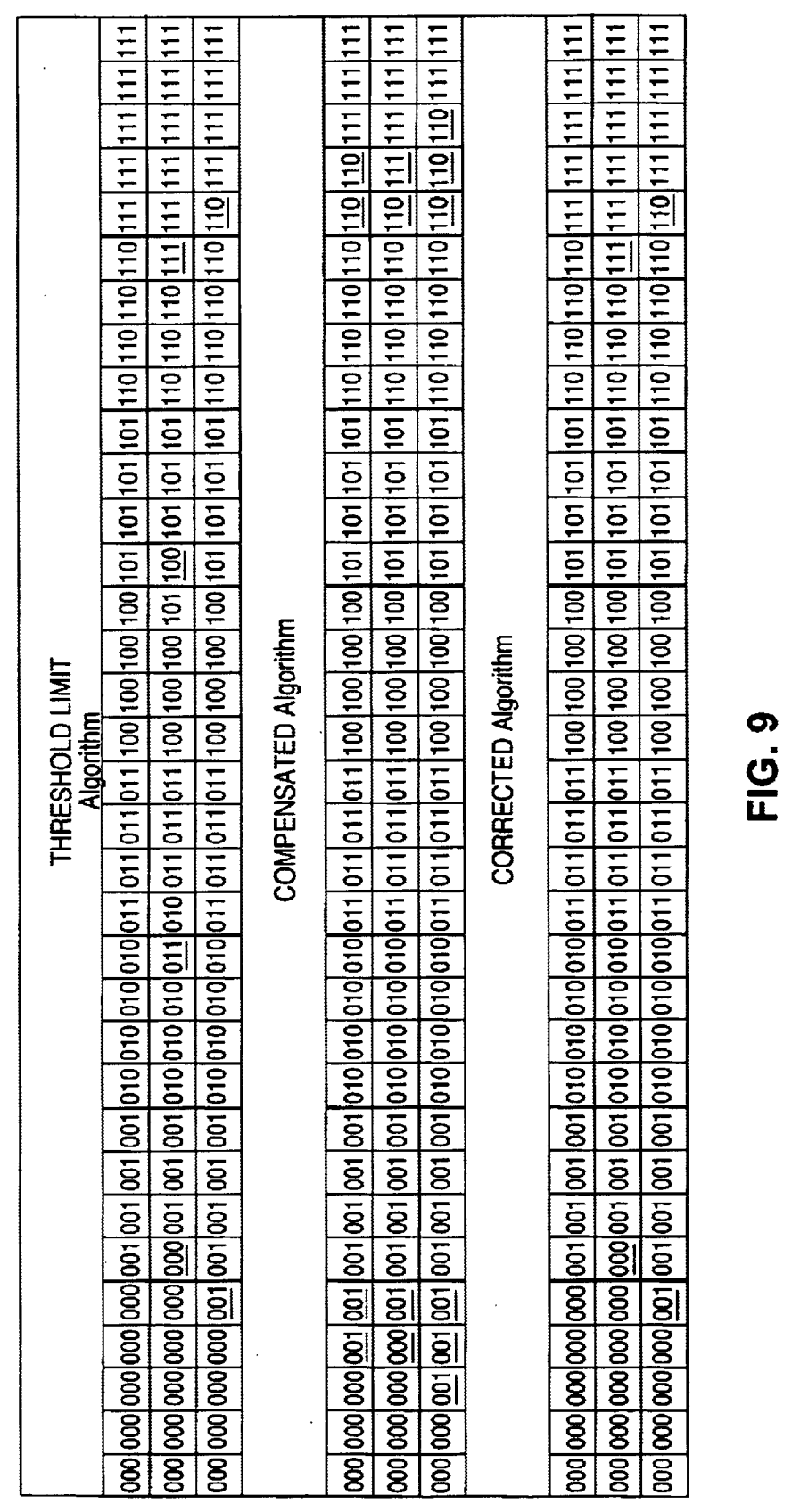

Turning to FIG. 8, illustrated is a graphical diagram of a residue plot of an exemplary three-bit ADC (generally designated 800) in accordance with the principles of the present invention. As shown in FIG. 8, exemplary three-bit ADC 800 receives an input voltage Vin(t) into sample and hold amplifier SHA. The output signal from SHA is received in the first stage of ADC 800. The first stage of ADC 800 is designated Stage 6 because it is equivalent to Stage 6 of pipelined ADC 110. The second stage of ADC 800 is designated Stage 7 because it is equivalent to Stage 7 of pipelined ADC 110. Stage 6 and Stage 7 each provide two output bits to the Digital Correction Logic. Digital Correction Logic outputs three bits. According to this example, the residue plot is a plot of the residue of Stage 6 and the data outputs for each input range are marked therein. Stage 7 is defined as a two bit converter where the decision levels are set forth in FIG. 8, wherein "FS" represents the full scale input voltage range of the pipelined ADC. Turning momentarily to FIG. 9, illustrated is a table of a code map for the three-bit analog-to-digital converter of FIG. 8 comparing the threshold limit algorithm, the compensated algorithm and a corrected algorithm in accordance with the principles of the present invention. From the example of FIG. 8 and the table of FIG. 9, it is clear that the present invention provides, for use in digital signal processing system 100, a pipelined ADC 110 that includes endpoint correction circuitry, associated with the three-state binary adder, that is operable to (i) use ±½ full scale trip voltages and (ii) generate over and under indicators.

Figure 10A:
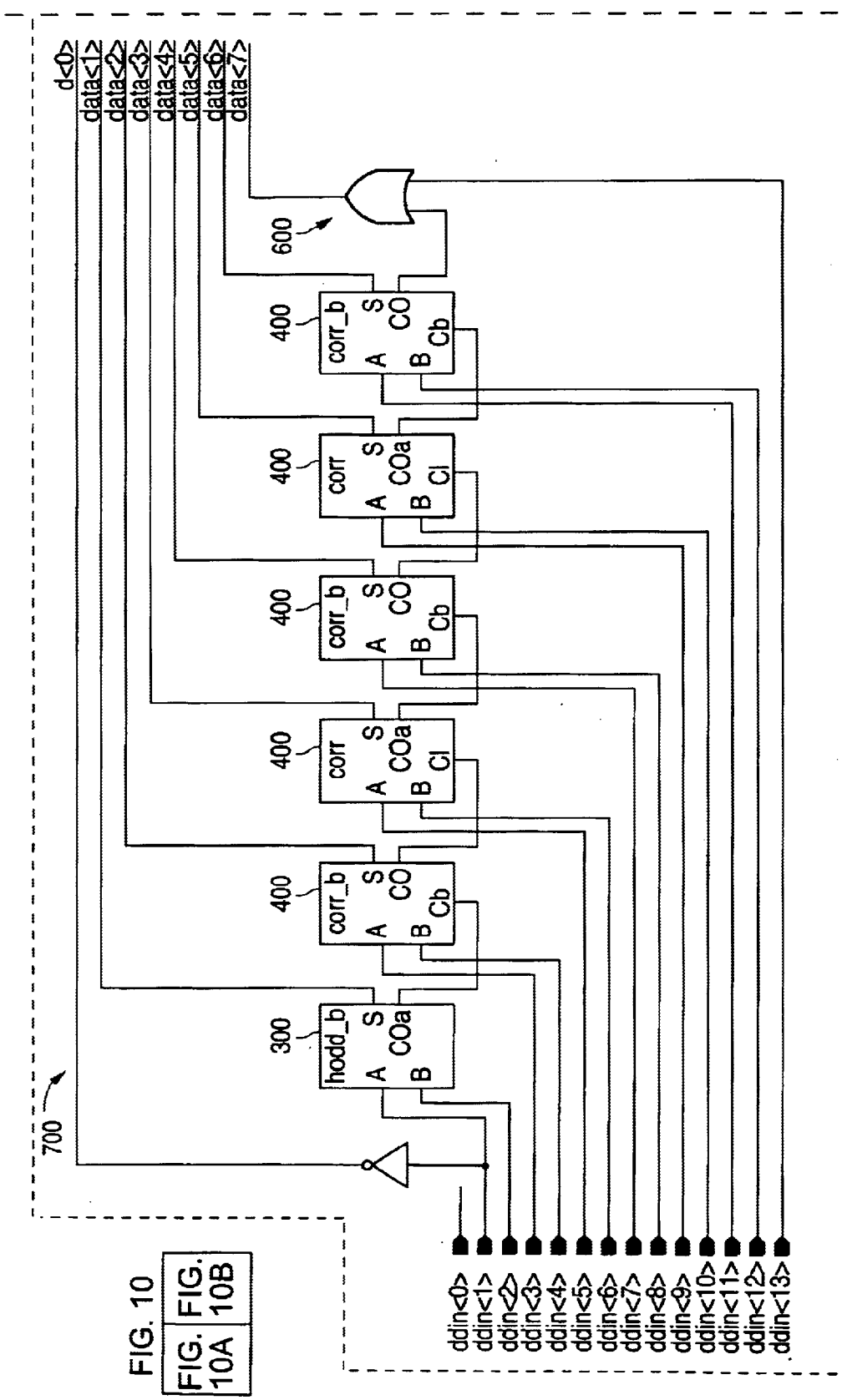
FIG. 10A illustrates a first portion of a block diagram of the pipelined analog-to-digital converter of FIG. 1 which includes a fully corrected adder with endpoint correction in accordance with the principles of the present invention.
Figure 10B:
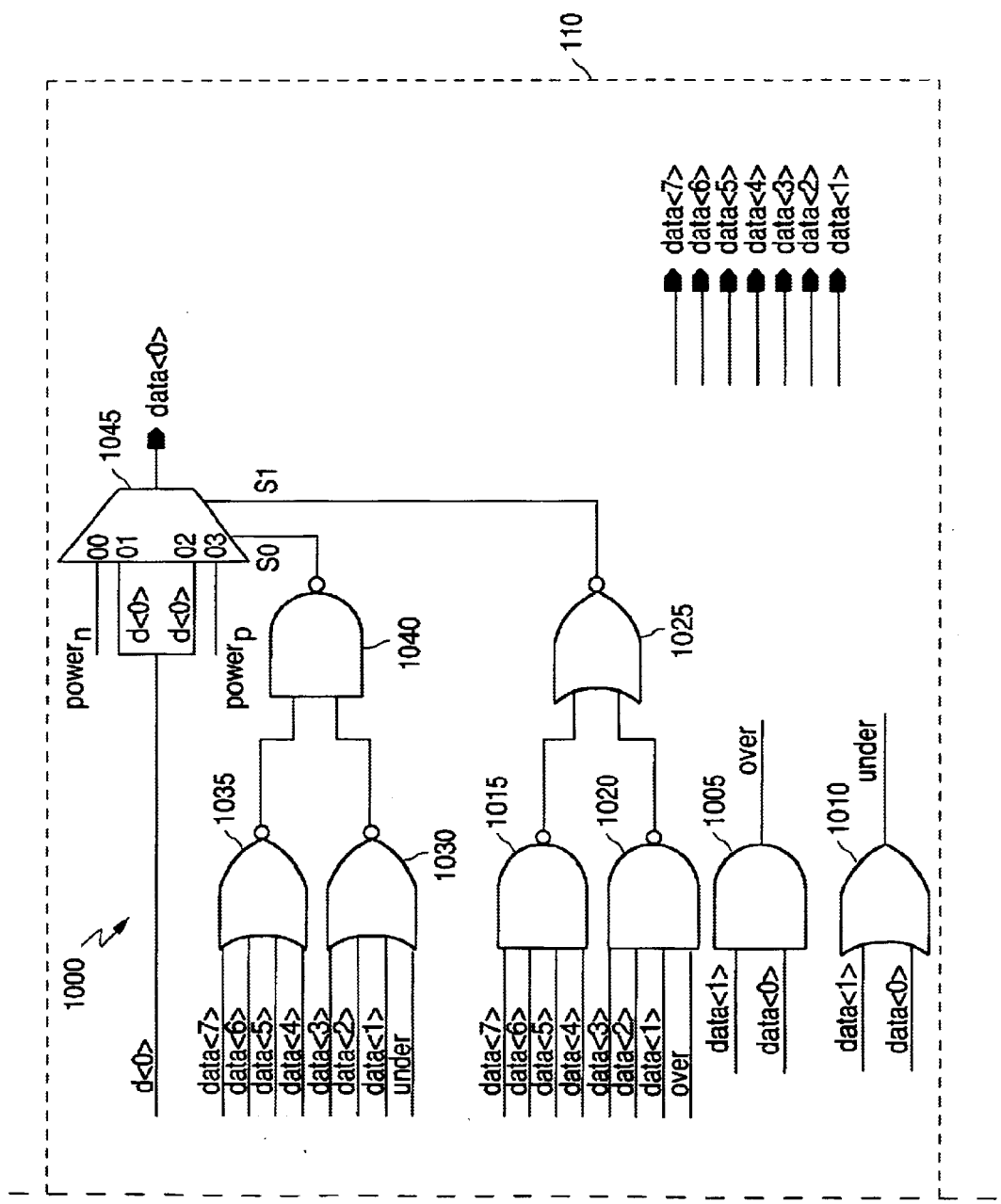
FIG. 10B illustrates a second portion of a block diagram of the pipelined analog-to-digital converter of FIG. 1 which includes a fully corrected adder with endpoint correction in accordance with the principles of the present invention.
Figure 11:
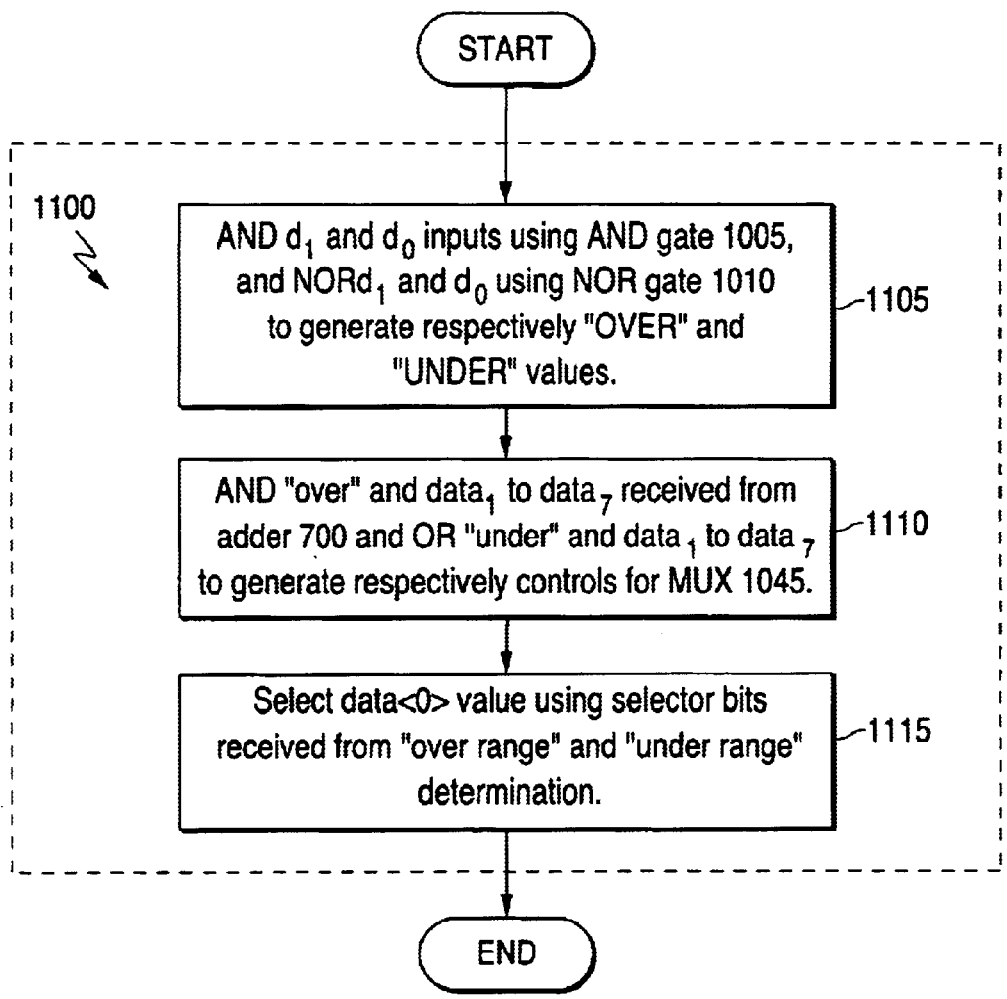
FIG. 11 illustrates a flow diagram of a method of operating the pipelined analog-to-digital converter of FIG. 1 which includes the fully corrected adder of FIG. 10 with endpoint correction in accordance with the principles of the present invention.

Turning to FIG. 10A and FIG. 10B, illustrated is a block diagram of the pipelined ADC 110 which includes a fully corrected adder 700 with endpoint correction circuitry (generally designated 1000) in accordance with the principles of the present invention. Reference is made concurrently to FIG. 11, which illustrates a flow diagram of a method (generally designated 1100) of operating endpoint correction circuitry 1000 of fully corrected adder 700 in accordance with the principles of the present invention. As shown in FIG. 10A, the inputs on the input lines to fully corrected adder 700 are ddin<0> through ddin<13> and the outputs on the output lines of fully corrected adder 700 are d<0> through data<7>. As shown in FIG. 10B, the outputs of fully corrected adder 700 serve as inputs to gates 1005, 1010, 1015, 1020, 1030, 1035 and 1045. The seven elements on the right side of FIG. 10B indicate that pipelined ADC 110 outputs data on output lines data<1> through data<7>. Exemplary method 1100 of operating the endpoint correction circuitry 1000 functions to eliminate both DNL error and non-monotonicity problems discussed above. Method 1100 has trip points of ±½ full scale and, unlike the other methods discussed, has four bits of output, two for data and two for error correction. These four bits are denoted as $d_1$, $d_0$, over, and under. The data values for regions of operation are listed in TABLE 6:

TABLE 6

| $V_{IN}$ STATE | $d_1d_2$ | OVER | UNDER |
|---|---|---|---|
| $V_{in} \geq +½$ FS | 11 | 1 | 0 |
| $V_{in} > 0$ | 10 | 0 | 0 |
| $V_{in} < 0$ | 01 | 0 | 0 |
| $V_{in} \leq -½$ FS | 00 | 0 | 1 |

To begin, AND $d_{in1}$ and using AND gate 1005 to generate an "over" bit and OR $d_{in1}$ and $d_{in0}$ using OR gate 1010 to generate an "under" bit (process step 1105), indicating "over-ranged" and "under-ranged," respectively.

Next AND "over" bit and $data_1$ to $data_7$ received from adder 700 using NAND gates 1015, 1020 and NOR gate 1025, and OR "under" bit and $data_1$ to $data_1$ using NOR gates 1030, 1035 and NAND gate 1040 to generate respectively control signals for the selector bits ($s_0$, $s_1$) for multiplexer 1045 (process step 1110). Exemplary multiplexer 1045 includes four inputs, namely $power_0$, $power_p$, and d<0> (twice).

Finally, select and output d<0> from multiplexer 1045 using selector bits $s_0$, $s_1$ (process step 1115). An analysis of the residue applied to the two-bit stage shows that it is required to supply data values of "10" or "01" throughout the code range except at code ($2^n$-1) and code "0". Under these endpoint conditions, the two-bit stage adds "1" or subtracts "1" from the final code value respectively. The "over" and "under" range bits are used to detect these endpoints. In short, a logical AND is applied to data bits 7 to 1 and "over". If the result is a "1", the "1" is essentially added to the final code value. Further, a logical "OR" is applied to data bits 7 to 1 and "under". If the result is "0", then "1" is subtracted from the final code value. Under all other circumstances, standard error correction may be implemented.

According to the illustrated embodiment, endpoint correction circuitry 1000 is operable to use ±½ full scale trip voltages and to generate over and under indicators to eliminate both DNL error and non-monotonicity problems in endpoint correction. An important aspect of the illustrated embodiment is that method 1100 doubles the error bound to −½/+∞ full scale, thereby eliminating non-monotonic errors by eliminating the overlapping error correction states, and setting the positive and negative full scale trip points to the correct location.

Although the present invention has been described in detail, those skilled in the art should understand that they can make various changes, substitutions and alterations herein without departing from the spirit and scope of the invention in its broadest form. To that end, it should be noted that the functionality and cooperation provided by the exemplary circuitry discussed herein may suitably be provided or implemented in alternate circuit logic.

What is claimed is:

1. For use in a digital signal processing system, a pipelined analog-to-digital converter comprising:
    a three-state adder that is operable to add received signals; and
    endpoint correction circuitry, associated with said three-state adder, that is operable to use ±½ full scale trip voltages to generate an over indicator and an under indicator.

2. The pipelined analog-to-digital converter according to claim 1, further comprising:
    a three-state adder within each of a plurality of adder stages in the pipelined analog-to-digital converter, each three-state adder summing overlapping bits for digital representations of input voltage approximations by successive adder stages and a carry bit from a previous adder stage within the pipelined analog-to-digital converter, wherein each three-state adder produces sum and carry outputs which may not both be concurrently asserted.

3. The pipelined analog-to-digital converter according to claim 1, further comprising:
    a final adder stage in the pipelined analog-to-digital converter producing one or more error correction data bits produced, the one or more error correction data bits indicating whether a residue voltage applied to an input of the final adder stage exceeds either a positive one-half full scale reference voltage or a negative one-half full scale reference voltage, wherein the over indicator and the under indicator are derived from the one or more error correction data bits.

4. The pipelined analog-to-digital converter according to claim 3, wherein the one or more error correction data bits further comprise:
    a pair of error correction data bits indicating whether the residue voltage applied to the input of the final adder stage:
        exceeds the positive one-half full scale reference voltage;

positively exceeds zero but not the positive one-half full scale reference voltage;

negatively exceeds zero but not the negative one-half full scale reference voltage; or exceeds the negative of one-half full scale reference voltage.

5. The pipelined analog-to-digital converter according to claim 1, wherein the over indicator, when asserted, indicates that a residue voltage applied to an input of the final adder stage exceeds a positive one-half full scale reference voltage and the under indicator, when asserted, indicates that the residue voltage applied to an input of the final adder stage exceeds a negative one-half full scale reference voltage.

6. The pipelined analog-to-digital converter according to claim 1, further comprising:

an AND gate logically ANDing all but a least significant bit of an output of the pipelined analog-to-digital converter and the over indicator; and logic adding one to the output of the pipelined analog-to-digital converter if the over indicator is asserted unless an output of the AND gate is also asserted.

7. The pipelined analog-to-digital converter according to claim 1, further comprising:

an OR gate logically ORing all but a least significant bit of an output of the pipelined analog-to-digital converter and the under indicator; and logic subtracting one from the output of the pipelined analog-to-digital converter if the under indicator is asserted unless an output of the OR gate is also asserted.

8. A signal processing system, comprising:

an input for receiving an analog voltage between a positive reference voltage and a negative reference voltage; and a pipelined analog-to-digital converter comprising:
 a three-state adder that is operable to add received signals; and
 endpoint correction circuitry, associated with said three-state adder, that is operable to use ±½ full scale trip voltages to generate an over indicator and an under indicator.

9. The signal processing system according to claim 8, further comprising:

a three-state adder within each of a plurality of adder stages in the pipelined analog-to-digital converter, each three-state adder summing overlapping bits for digital representations of input voltage approximations by successive adder stages and a carry bit from a previous adder stage within the pipelined analog-to-digital converter, wherein each three-state adder produces sum and carry outputs which may not both be concurrently asserted.

10. The signal processing system according to claim 8, further comprising:

a final adder stage in the pipelined analog-to-digital converter producing one or more error correction data bits, the one or more error correction data bits indicating whether a residue voltage applied to an input of the final adder stage exceeds either a positive one-half full scale reference voltage or a negative one-half full scale reference voltage, wherein the over indicator and the under indicator are derived from the one or more error correction data bits.

11. The signal processing system according to claim 10, wherein the one or more error correction data bits further comprise:

a pair of error correction data bits indicating whether the residue voltage applied to the input of the final adder stage:
 exceeds the positive one-half full scale reference voltage;
 positively exceeds zero but not the positive one-half full scale reference voltage;
 negatively exceeds zero but not the negative one-half full scale reference voltage; or
 exceeds the negative of one-half full scale reference voltage.

12. The signal processing system according to claim 8, wherein the over indicator, when asserted, indicates that a residue voltage applied to an input of the final adder stage exceeds a positive one-half full scale reference voltage and the under indicator, when asserted, indicates that the residue voltage applied to an input of the final adder stage exceeds a negative one-half full scale reference voltage.

13. The signal processing system according to claim 8, further comprising:

an AND gate logically ANDing all but a least significant bit of an output of the pipelined analog-to-digital converter and the over indicator; and logic adding one to the output of the pipelined analog-to-digital converter if the over indicator is asserted unless an output of the AND gate is also asserted.

14. The signal processing system according to claim 8, further comprising:

an OR gate logically ORing all but a least significant bit of an output of the pipelined analog-to-digital converter and the under indicator; and logic subtracting one from the output of the pipelined analog-to-digital converter if the under indicator is asserted unless an output of the OR gate is also asserted.

15. A method for producing an error corrected analog-to-digital conversion, comprising:

adding received signals for a pipelined analog-to-digital converter employing a three-state adder; and utilizing ±½ fill scale trip voltages in endpoint correction circuitry associated with said three-state adder to generate an over indicator and an under indicator.

16. The method according to claim 15, further comprising:

utilizing a three-state adder within each of a plurality of adder stages in the pipelined analog-to-digital converter, summing overlapping bits for digital representations of input voltage approximations by successive adder stages and a carry bit from a previous adder stage within the pipelined analog-to-digital converter, wherein each three-state adder produces sum and carry outputs which may not both be concurrently asserted.

17. The method according to claim 15, further comprising:

producing one or more error correction data bits with a final adder stage in the pipelined analog-to-digital converter, the one or more error correction data bits indicating whether a residue voltage applied to an input of the final adder stage exceeds either a positive one-half full scale reference voltage or a negative one-half full scale reference voltage, wherein the over indicator and the under indicator are derived from the one or more error correction data bits.

18. The method according to claim 17, wherein the one or more error correction data bits further comprise:
   a pair of error correction data bits indicating whether the residue voltage applied to the input of the final adder stage
   exceeds the positive one-half full scale reference voltage;
   positively exceeds zero but not the positive one-half full scale reference voltage;
   negatively exceeds zero but not the negative one-half full scale reference voltage; or
   exceeds the negative of one-half full scale reference voltage.

19. The method according to claim 15, wherein the over indicator, when asserted, indicates that a residue voltage applied to an input of the final adder stage exceeds a positive one-half full scale reference voltage and the under indicator, when asserted, indicates that the residue voltage applied to an input of the final adder stage exceeds a negative one-half full scale reference voltage.

20. The method according to claim 15, further comprising:
   logically ANDing all but a least significant bit of an output of the pipelined analog-to-digital converter and the over indicator;
   adding one to the output of the pipelined analog-to-digital converter if the over indicator is asserted unless an output of the AND gate is also asserted
   logically ORing all but a least significant bit of an output of the pipelined analog-to-digital converter and the under indicator; and
   subtracting one from the output of the pipelined analog-to-digital converter if the under indicator is asserted unless an output of the OR gate is also asserted.

* * * * *